United States Patent [19]

Krumme

[11] 4,126,758
[45] Nov. 21, 1978

[54] METHOD FOR SEALING INTEGRATED CIRCUIT COMPONENTS WITH HEAT RECOVERABLE CAP AND RESULTING PACKAGE

[75] Inventor: John F. Krumme, Woodside, Calif.

[73] Assignee: Raychem Corporation, Menlo Park, Calif.

[21] Appl. No.: 465,561

[22] Filed: Apr. 30, 1974

Related U.S. Application Data

[63] Continuation-in-part of Ser. No. 421,429, Dec. 3, 1973, abandoned.

[51] Int. Cl.$^2$ .................. H05K 5/06; H05K 5/03; B23P 11/02
[52] U.S. Cl. .................. 174/52 FP; 29/447; 29/588; 220/201; 220/305; 357/74
[58] Field of Search ........ 174/52 S, DIG. 3, DIG. 8, 174/52 FP, 52 H; 29/447, 627, 588–590; 285/381; 220/24 A, 201, 305, 352; 317/101 CP; 357/74; 264/230

[56] References Cited

U.S. PATENT DOCUMENTS

| 1,058,210 | 4/1913 | Welch | 220/305 X |
| 1,981,334 | 11/1934 | Schmalz | 220/24 AU |
| 3,174,620 | 3/1965 | Edgarton | 220/24 A X |
| 3,714,370 | 1/1973 | Nixen et al. | 174/52 S |

FOREIGN PATENT DOCUMENTS

| 872,850 | 7/1961 | United Kingdom | 285/381 |
| 1,076,494 | 7/1967 | United Kingdom | 220/201 |

*Primary Examiner*—Laramie E. Askin
*Attorney, Agent, or Firm*—Lyon & Lyon

[57] ABSTRACT

A method of sealing electrical components by positioning over the electrical component a heat recoverable sealing member. When a metal sealing member is utilized, the metal is in a deformed, unstable martensitic state, and thereafter is allowed to heat recover to a stable, austenitic state. When a plastic material is used, the polymer is heated, deformed and quenched in an unstable state, so upon heating it recovers via its elastic memory to a stable state.

16 Claims, 11 Drawing Figures

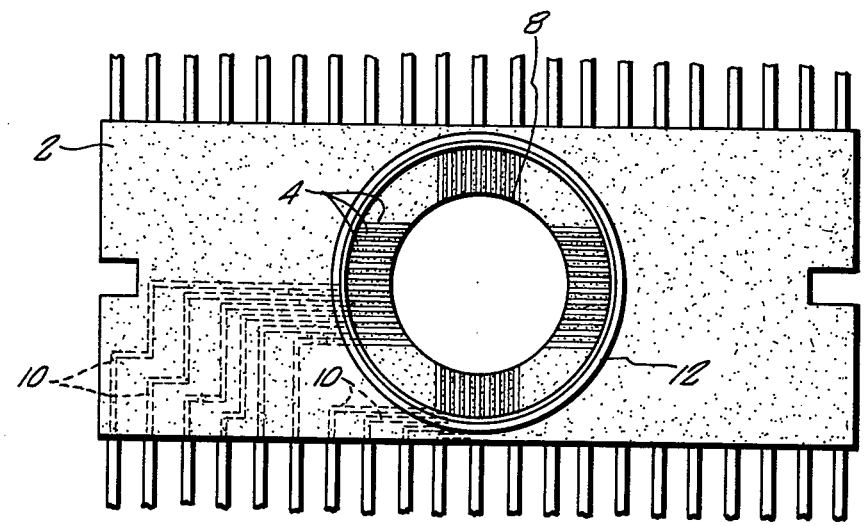
FIG_1.
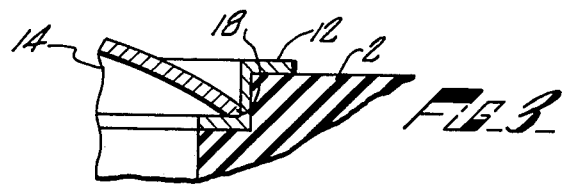
FIG_3.
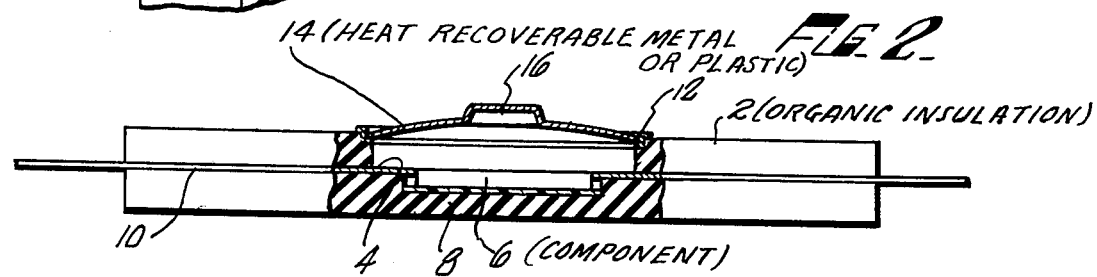
FIG_2.
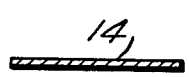
FIG_4a_
FIG_5a_
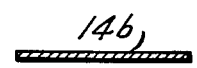
FIG_6a_
FIG_4b_
FIG_5b_
FIG_6b_

METHOD FOR SEALING INTEGRATED CIRCUIT COMPONENTS WITH HEAT RECOVERABLE CAP AND RESULTING PACKAGE

CROSS REFERENCE TO RELATED APPLICATIONS

This is a continuation in part of application Ser. No. 421,429 filed Dec. 3, 1973, now abandoned.

BACKGROUND OF THE INVENTION

The sealing of electrical components so as to prevent contamination and deterioration from exposure to the atmosphere is important for many applications and in some instances is critical. The sealing of electrical components is particularly important in the field of semiconductor packaging. The microcircuitry of the semiconductor chip may readily undergo failure since the circuitry on such miniature components is often on the order of microns, such circuit dimensions being readily subject to short or open failure upon exposure to the environment. In addition to failure of the connective circuitry, atmospheric contamination of the semiconductor material itself may drastically effect its electrical response.

Some components are often sealed and protected from the atmosphere by fusing a glass layer thereover. Alternatively, a metal cap may be used to seal the electrical components by soldering the cap over the substrate on which the semiconductor chip has been mounted.

Such prior art methods of sealing electrical components to protect them from the environment requires subjecting the electrical device to considerable thermal stress, since the solder or glass must be heated to its melting temperature. For many electrical applications such as where expensive, high density semiconductor chips are utilized, a hermetic seal is required. Such a seal allows no detectable leakage when tested with a helium mass spectrometer leak tester of sensitivity $1 \times 10^{-8}$ ssc/sec. in accordance with MIL-Standard 883. Prior art methods of forming such seals have generally involved delicate and expensive sealing operations such as precious metal soldering or the fusion of a sealing glass to itself and to metallic leads.

Also, once a component is protected from the atmosphere by such prior art methods, it cannot be easily replaced. Rather, if changes in circuitry are required, the fabrication of an entirely new package is often required. It is thus an object of this invention to provide a method of sealing electrical components which is more reliable and less costly than the methods of the prior art.

It is another object of this invention to provide a method of sealing electrical components which will not subject the electrical component or substrate to excessively high temperatures, thereby permitting the use of a wider range of component materials and substrates, including plastics.

It is still another object of this invention to provide a sealing means which may be readily removed so that access to the sealed electrical component may be had if repair or replacement of the component is desired.

SUMMARY OF THE INVENTION

These objects are accomplished by providing a heat recoverable sealing member which will change dimension and seal the electrical component upon the application of heat. In the case of metal sealing members, the metal will readily deform when cooled to temperatures below its martensitic transition temperature, but upon warming will be urged to recover to its original configuration. By deforming the metal sealing member while in the unstable, martensitic state to such a dimension that it fits snugly within a substrate onto which the electrical component has been placed, inserting it into the substrate and warming the sealing member to its stable austenitic state to cause the sealing member to attempt to recover to its original configuration, a substantial force is exerted by a sealing member against the substrate into which it has been inserted. The force is sufficient to seal the electrical component. Likewise, in the case of plastic sealing members, by heating and deforming a polymeric material to the proper dimension and then quenching it at that dimension, upon heating, the plastic will attempt to recover to its original configuration. By accurately dimensioning the sealing member as well as the substrate, sealing pressure may be accurately and reproducibly controlled so as to seal the electrical components.

In the case of metals, transition to the austenitic stable state generally occurs at or below room temperature so the electrical components are not subjected to heat which may cause thermal degradation. In the case of heat recoverable plastics, heat recovery will generally take place at or below 300° F., well below temperatures which will cause thermal degradation of solder connections or oxidation of conductors.

BRIEF DESCRIPTION OF THE DRAWINGS

FIG. 1 is a top view of an electronic package onto which may be positioned an electronic component, such as a semiconductor chip and over which is then placed a heat recoverable sealing member.

FIG. 2 is a sectioned view of the electronic package and into which the electrical component and the sealing member have been inserted.

FIG. 3 is an enlarged view at the sealing member, substrate wall interface of FIG. 2.

FIGS. 4 a–b, 5 a–b and 6 a–b are section views of metal sealing members before and after deformation which may be used in accordance with this invention.

PREFERRED EMBODIMENT

Figure 7:
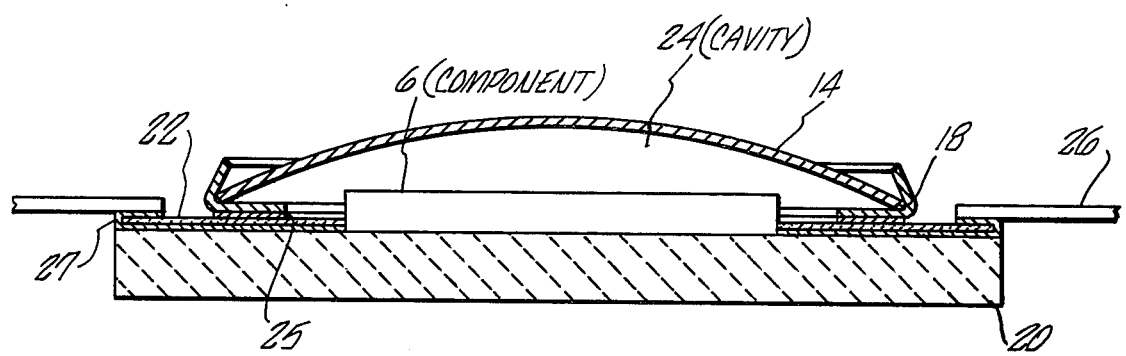
FIG. 7 is a sectioned view of an electrical component having a sealing ring into which the sealing member is inserted, the sealing ring being so configured as to permit the sealing member, upon expansion, to wedge itself into the ring.

Heat-recoverable materials, i.e., those which dimensionally recover from a heat unstable configuration to heat stable configuration upon the application of heat, have been used for a wide variety of applications. With respect to metal heat recoverable materials, various alloys of titanium and nickel have heretofore been disclosed as susceptible to the impartation of heat recoverability by dimensional deformation at a temperature in which the metal exists in its martensitic state. Examples of such alloys may be found in U.S. Pat. Nos. 3,174,851; 3,351,463; 3,753,700; 3,759,522. Applications for these alloys include their use for the coupling of conduit, such as hydraulic pipelines as generally disclosed in application Ser. No. 852,722 "HEAT RECOVERABLE METALLIC COUPLING", filed Aug. 25, 1969 (now abandoned) and assigned to the same assignee as the present invention. In the coupling of conduit, the heat recoverable metal is formed in a generally cylindrical shape expanded in its unstable, martensitic state and placed over the ends of the conduit to be coupled. Upon warming to the stable, austenitic state, the expanded heat recoverable cylinder recovers towards its original dimensions thereby coupling and sealing the pipes over which it has been placed.

In addition to use for coupling of pipes and conduits, heat-recoverable metals have also been utilized for the plugging and sealing of pipes, as generally disclosed in "METAL EXPANSION PLUG", filed Jan. 4, 1973, Ser. No. 320,930 and assigned to the same assignee as the present invention. The application generally discloses round plugs to fit apertures in pipes, drums or tanks which conventionally use screw-type force-fitting plugs. Thus, prior art sealing applications for heat-recoverable metals have generally been limited to the coupling or sealing of conduit or containers so that the gas or liquid therein will not leak into the atmosphere.

Similarly, sealing applications for heat-recoverable plastic materials have generally been limited to the coupling or sealing of conduits or containers so that the gas or liquid therein will not leak into the atmosphere. For example, in U.S. Pat. No. 3,741,422, a heat-recoverable plastic material is used for sealing bottles.

Applicants have now discovered an entirely new and unrelated use for these heat-recoverable materials. Heat-recoverable materials may be used in electrical component manufacture for sealing the electrical components from the atmosphere, such sealing means being easier and more reliable than prior art sealing means utilized in the electronics industry.

Referring now to FIGS. 1 and 2 a top and side view of an electronics package which may be utilized in accordance with this invention is shown. A suitable substrate, 2, is metallized with electrical conductors 4, to provide input, output means for the electrical component, 6, shown in FIG. 2. Substrate 2 may be made of any insulative material including inorganic insulators (ceramics, glass) or organic insulators (epoxy, phenolic, melamine, nylon, polyesters, Teflon, polyimides and polyarylene). When organic insulators are used as the substrate material, reinforcing agents such as glass fiber or microspheres are desirable to impart required rigidity to the electronic package. A metallized die attach pad, 8, is utilized for receiving the component 6 to be attached and electrically connected. The die attach pad, 8, is generally metallized with a noble metal such as gold. Likewise, conductors 4 may have a top layer of gold, beneath which may be less expensive metals such as copper. Preferably, the metal conductors 4 are deposited onto the substrate 2 via known techniques such as sputtering, vapor deposition or electroplating. However, discreet wiring may also be used in the electronic package of this invention. Electrical conductors 4 are then connected to a second level packaging, now shown, via conductors 10. The substrate 2 may be of the multi-layer variety so that the conductors 10 are sandwiched therebetween. Such substrates permit denser packaging since multilayer circuitry may be utilized. Of course, a single layer substrate may also be utilized where high circuit density is not required. As best seen in FIG. 2, a wall 12 is provided for encompassing the die attach pad upon which the electrical component is to be attached. The wall may be an integral part of the substrate, and have the same composition as the substrate. Due to the hardness of inorganic substrates such as ceramic or glass, it is preferable to provide a wall having an inner surface of considerably softer material. Thus, a separate metallic ring may be attached to the ceramic substrate, the ring having that portion of its inner surface which is contacted by the heat-recoverable member coated with a soft metal such as gold, or nickel. Of course, where the wall 12 and the substrate 2 are an integral component, such as ceramic, the inner wall may still be coated with a softer material such as gold, nickel or tin. When softer, organic insulators are utilized as the substrate and wall, coating of the interior surface of the wall with a soft material is not necessary. However, even if the interior surface of the wall is a suitable soft material, it may still be desirable to provide a sealing ring into which the sealing member can be tightly wedged, as for example, the ring shown in FIG. 7.

After positioning of the electronic component 6 over pad 8, a heat recoverable member 14 is placed into the walls 12 and over the component 6 so as to seal the component from the atmosphere. Member 14 may be made of any material having the capability of heat recovering and exerting a force when passed from its deformed, unstable state to a more stable state. For metal sealing members, metals generally having transition temperatures within the range of $+135°$ C. to $-196°$ C. are satisfactory for use in this invention. Preferably, the sealing member is prepared from a planar disc of a nickel titanium alloy containing 47.1% nickel, 49.4% titanium, and 3.5% iron. This composition results in a material with a transition temperature of approximately $-125°$ C. The disc is reduced to a temperature below its transition temperature by immersing it in liquid nitrogen which exhibits a stable temperature of $-196°$ C. While held at this reduced temperature, the disc is subjected to sufficient force, e.g., in a press, to cause thermally recoverable plastic deformation to take place whereby the disc is placed in a heat-unstable dished configuration. The deformed disc is held at a temperature below its transition temperature, e.g., by continued immersion in liquid nitrogen, until it is ready for use.

The disc is inserted into the walled substrate while in the cooled state, after which it is allowed to warm. This method results in little if any thermal stress. Obviously, the electrical component is not subjected to high temperatures as was the case with the prior art methods. In most instances, the entire electronic package can be cooled to liquid nitrogen temperature during the sealing operation, although this is not required.

Alternately, member 14 may be made of a polymer material capable of being made heat-recoverable so as to exert a force when caused to recover. Heat-recoverable materials and their method of manufacture are well known, for example, see U.S. Pat. No. 3,415,287. To assure that the plastic member will completely seal the electrical component, hard, non-deformable plastics are preferred when the substrate wall or sealing ring is fabricated from a soft, deformable material. Alternately, the plastic sealing member may be made of a softer, deformable material when the ring or wall is a hard, non-deformable material. However, the material should be so selected and dimensioned to assure that sufficient pressure is exerted on the substrate wall or ring to cause the softer material at the interface to deform and seal the electrical component.

Particularly suitable for such applications are polyarylene plastics. Because of their highly crystalline nature, even without cross linking, the polymer can be deformed at room temperature and have sufficient elastic memory to return to its original configuration upon heating, thereby exerting a force sufficient to seal the electrical component.

The configuration of sealing member 14 should be such as to fit easily into walls 12 while in the deformed state. The use of round walls with a heat-recoverable member which has been deformed from a flat shape to a dish is particularly suited for this application since the sealing pressures on the wall may be readily calculated. Protrusion 16 may be provided on the heat recoverable member, so as to allow a holding tool to insert and properly position the member within the walls of the electronic package.

Referring to FIG. 3, wall 12 may be provided with a lip 18 to receive the heat recoverable member. The lip surface at which a seal between a heat-recoverable member and the wall is formed should be of a material which will deform upon the exertion of force by the heat-recoverable material. In the case of a titanium-nickel metal sealing member, the lip surface should be of a material softer than the titanium-nickel, e.g., gold, nickel or plastic.

By the use of a dish-shaped heat-recoverable material, the force upon the wall may be easily estimated. The force should be such as to sufficiently deform the inner wall surface to seal the component, yet not exert such force as to crack the wall or the substrate. For a dish-shaped heat-recoverable member, the force on the edge may be calculated by using stress-strain formulas such as that found in "Formulas for Stress-Strain", Roark, 4th Edition, McGraw Hill, 1965, page 303. By adjusting the height and thickness of the disc, the force at the substrate walls may be controlled so as to give a sealed electronic component without any danger of cracking.

The transverse dimension of the deformed disc should be slightly less than the transverse dimensions of the wall at the lip area. Thus for a wall dimension of 0.500 inch the transverse dimension of the disc is 0.495 inch. With these dimensions, the disc may be easily placed inside the wall cavity while in the unstable state, but cannot return to its original undeformed substantially flat configuration of slightly greater than 0.500 inch upon warming, thereby exerting pressure to seal the electronic component enveloped therein.

Although the use of disc-shaped sealing members are preferred since the force of a disc is readily estimated, it will be understood that the particular size and shape of the heat-recoverable member will often be dictated by the configuration of the electronic package. The edge force of various other configurations, including squares and rectangles, may be approximated from stress-strain formulas and are within the scope of this invention.

The surface configuration of the sealing members may be designed and deformed so as to increase the sealing force or aid in insertion of the member into the substrate walls. FIG. 4a is a cross-sectional view of a flat disc 14 prior to deformation with FIG. 4b depicting the disc 14 after deformation. Upon warming the deformed disc to its stable state, the disc will tend to return to the original shape, thereby exerting a force against the substrate walls.

FIGS. 5a and b depict a disc cross section 14a before and after deformation having a large control protrusion which aids in the insertion of the disc into the walls of the substrate.

FIGS. 6a and 6b depict a flat disc 14b which is deformed into a "doughnut" shape. This configuration results in a substantially horizontal force being exerted by the member against the substrate wall on warming.

FIG. 7 illustrates the use of a sealing ring so the sealing member 14 does not directly contact the substrate walls. The ring, 18, is preferably made of a rigid material, such as Kovar. Preferably, the ring is configured with an inward bend so as to form a V-shape into which the sealing member, upon recovery, will wedge. Unlike the straight side wall configuration, as best seen in FIG. 3, the V configuration insures retention of the disc and a "double seal" on two surfaces of the ring. The ring 18 is bonded to substrate 20, of ceramic or other insulating material, on metallized ceramic pads 22 by known techniques such as soldering or brazing to metallized surface 25. The ring is placed over the cavity 24 into which the electrical component is inserted. The electrical component is connected to input, output leads 26 through metallized conductors 27.

Figure 8:
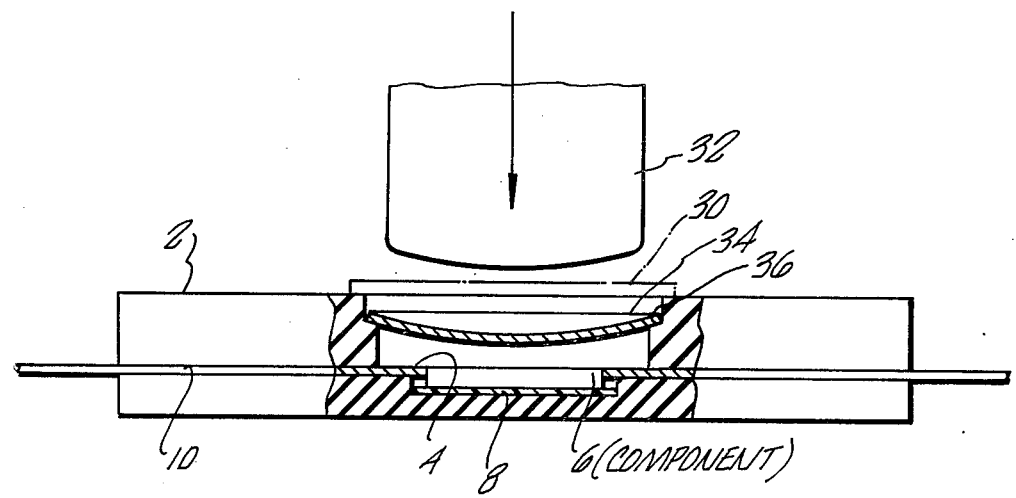
FIG. 8 depicts a method for deforming and inserting the sealing member in one operation.

FIG. 8 illustrates a method of deforming and sealing the electrical component in one operation. An electrical component, similar to that shown in FIG. 2, is sealed via a heat-recoverable member 30 which is deformed by punch 32 into a concave configuration 34. The top walls of the substrate define an opening slightly less than the undeformed sealing member, so that upon insertion, the member is deformed to the concave configuration shown. A portion of the walls may be curved to form a lip 36 upon which the concave sealing member will sit flush. The lip also serves as a stop to prevent pressing of the sealing member against the electrical component 6 which is positioned over attach pad 8, to prevent damage.

In the case of a metal sealing member, the member is inserted and deformed in its unstable martensitic state, and after insertion allowed to return to its stable austenitic state. The member will attempt to return to its original flat configuration, exerting pressure against the walls and sealing the electrical component.

In the case of a plastic sealing member, a heat-recoverable material is deformed during insertion, after which it is heated to cause it to exert pressure and seal the electrical component.

Finally, the sealing means employed in this invention may be readily removed, exposing the electronic component if repair or replacement is necessary. With prior art sealing devices such as sealing glass or solder caps, it is impossible to remove the sealing member without subjecting the package to high temperatures. To remove the sealing member of this invention, in the case of a metal member, the entire package is immersed in liquid nitrogen so as to cool the heat recoverable member to below its martensitic transition temperature. At this temperature, the member may be deformed and removed so as to expose the electrical component. In the case of plastic sealing members, the plastic is heated to a temperature where it can be deformed and removed from the package.

The protrusion 16, as best seen in FIG. 2, permits grasping of the sealing member so as to allow easy removal. Alternatively, in the case of metals, the member may be removed by crushing while in the austenitic state.

What is claimed is:

1. A method of sealing a container having at its open end a sealing ring, said sealing ring having a substantially horizontal portion joined to a wall portion to form an acute angle defined by a surface of the horizontal portion and the inner surface of the wall portion, the method comprising bringing a member capable of being rendered heat recoverable to a temperature at which it is at its heat-unstable state and deforming said member in its unstable state to render it heat-recoverable; inserting said heat-recoverable member into an area having a transverse dimension defined by said sealing ring, the heat-recoverable member having a transverse dimension approximately equal to the transverse dimension of said sealing ring; and bringing said heat-recoverable member to a temperature at which it recovers to cause the transverse dimension of said heat-recoverable member to increase whereby said heat-recoverable member, as it recovers from its heat-unstable state, exerts sufficient pressure against the sealing ring to seal said container.

2. A sealed container having contents therein comprising an integral bottom and vertical walls and having contiguous with the vertical walls at its sealed end a sealing ring, said sealing ring having a substantially horizontal portion joined to a wall portion to form an acute angle defined by a surface of the horizontal portion and the inner surface of the wall portion, and having inserted within the area defined by said sealing ring a heat-recoverable sealing member which exerts sufficient pressure against said sealing ring to seal the container.

3. A method of sealing an electrical component on a substrate, said substrate having means for electrically connecting the component and having walls to encompass the component, said method comprising:
   forming a sealing ring with an inward bend;
   attaching the sealing ring to the substrate;
   bringing a member capable of being rendered heat recoverable to a temperature at which it is at its heat-unstable state and deforming said member in its heat-unstable state to render it heat recoverable;
   inserting said member into an area having a transverse dimension defined by said sealing ring and over said component, the heat recoverable member having a transverse dimension approximately equal to the transverse dimension defined by said sealing ring;
   and bringing said member to a temperature at which it recovers to cause the transverse dimension of said member to increase whereby said member exerts sufficient pressure against said sealing ring to seal the electrical component enveloped therein when the member is in its heat-stable state.

4. The method of claim 3 wherein the step of deforming includes deforming the member from a substantially flat to a substantially dish-shaped configuration while in the unstable state prior to insertion so that after insertion, the heat recoverable member upon being brought to the temperature at which it recovers is urged to its original configuration thereby exerting pressure against the sealing ring to seal the electrical component.

5. The method of claim 3 wherein the step of deforming includes deforming the member from a substantially flat to a substantially dish-shaped configuration while in the unstable state during insertion so that after insertion, the heat recoverable member upon being brought to the temperature at which it recovers is urged to its original configuration thereby exerting pressure against the sealing ring to seal the electrical component.

6. A method according to claim 3 wherein the step of deforming includes deforming the member while in the unstable state from a substantially flat original configuration to impart to it an annular ridge thereby reducing its transverse dimension prior to insertion so that after insertion, the heat recoverable member upon being brought to the temperature at which it recovers is urged to its original configuration and thereby exerts pressure against the sealing ring to seal the electrical component.

7. A method according to claim 6 wherein the step of deforming includes deforming the member to impart to it an annular ridge inboard of the edge of the member.

8. An electronic package containing an electrical component comprising a substrate of a ceramic material having electrical conductors metallized thereon for electrically connecting the component, said substrate having walls to encompass the component, a metal ring bonded to the substrate and forming an extension of said walls, and a heat-recoverable sealing member inserted into the area defined by said walls over said component that has been recovered to exert sufficient pressure against said ring to seal the electrical component enveloped therein.

9. The package of claim 8 wherein the ring has an inward bend into which the sealing member is wedged upon recovery.

10. The package of claim 9 wherein the sealing member is a heat-recoverable metal.

11. The package of claim 10 wherein the inner surface of said walls is a soft metal such that upon recovery of said sealing member against said walls, the soft metal will deform to form a gas tight seal between the sealing member and the walls.

12. The package of claim 11 wherein the soft metal is selected from the group consisting of gold and nickel.

13. The package of claim 9 wherein the sealing member is a heat-recoverable plastic.

14. The package of claim 13 wherein the plastic is a polyarylene plastic.

15. A package according the claim 9 wherein the sealing member is provided with means to aid in its positioning within the walls of the substrate.

16. A package according to claim 15 wherein said positioning means is a protrusion from the top surface of the sealing member adapted to engage a holding tool.

* * * * *